(12) United States Patent
Jung et al.

(10) Patent No.: US 12,107,076 B2
(45) Date of Patent: Oct. 1, 2024

(54) THROUGH-SILICON VIA LAYOUT FOR MULTI-DIE INTEGRATED CIRCUITS

(71) Applicants: ADVANCED MICRO DEVICES, INC., Santa Clara, CA (US); ATI TECHNOLOGIES ULC, Markham (CA)

(72) Inventors: Wonjun Jung, Markham (CA); Jasmeet Singh Narang, Markham (CA); Tyrone Huang, Markham (CA); Christopher Klement, Markham (CA); Alan D. Smith, Santa Clara, CA (US); Edward Chang, Santa Clara, CA (US); John Wuu, Santa Clara, CA (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 317 days.

(21) Appl. No.: 17/564,137

(22) Filed: Dec. 28, 2021

(65) Prior Publication Data
US 2023/0207527 A1    Jun. 29, 2023

(51) Int. Cl.
  *H01L 25/065* (2023.01)
  *H01L 23/48* (2006.01)
(52) U.S. Cl.
  CPC ........ *H01L 25/0657* (2013.01); *H01L 23/481* (2013.01); *H01L 25/0652* (2013.01); *H01L 2225/06544* (2013.01)

(58) Field of Classification Search
  CPC ......... H01L 23/481; H01L 2225/06544; H01L 25/0657
  See application file for complete search history.

(56) References Cited

U.S. PATENT DOCUMENTS

| | | | |
|---|---|---|---|
| 8,445,918 B2 * | 5/2013 | Bartley | H01L 23/49838 257/77 |
| 2016/0118095 A1 * | 4/2016 | Pelley | H01L 25/0657 365/230.01 |
| 2019/0066738 A1 * | 2/2019 | Brox | G11C 5/04 |
| 2020/0043532 A1 * | 2/2020 | Brox | G11C 5/06 |
| 2023/0105149 A1 * | 4/2023 | Bourstein | H01L 23/5386 257/777 |

FOREIGN PATENT DOCUMENTS

CN         112733483 A   *   4/2021   ......... G06F 30/3323

* cited by examiner

*Primary Examiner* — Mamadou L Diallo

(57) ABSTRACT

Integrated circuits and integrated circuit dies include TSVs laid out in symmetrical patterns. Because of the symmetrical arrangement of the TSVs and associated routing patterns, an integrated circuit is able to support operation of multiple similar dies that are placed in different positions in the integrated circuit. This in turn simplifies the design and production of the multiple similar dies, thus reducing development and manufacturing costs for the corresponding integrated circuits.

20 Claims, 6 Drawing Sheets

THROUGH-SILICON VIA LAYOUT FOR MULTI-DIE INTEGRATED CIRCUITS

BACKGROUND

To enhance processing performance and efficiency, some processors are implemented as integrated circuits having multiple functional dies, with each functional die including circuitry to implement a set of corresponding functions, such as processing functions, memory functions, and the like. For example, some processors employ a chiplet-based design, wherein each of a plurality of processor dies implements a corresponding processor chiplet, with each chiplet designed and configured to execute at least a subset of designated processor operations, such as central processing unit (CPU) operations, graphics processing unit (GPU operations), and the like. The chiplets and other processor dies (e.g., memory dies) are arranged in a 3-dimensional stack above a base die and the stack is placed in an integrated circuit package. Because the multiple functional dies are in the same integrated circuit package, the dies are able to communicate and coordinate processing operations efficiently, and by consuming relatively little power. However, the multiple dies are sometimes placed on the 3-dimensional stack in different positions, requiring the design of a die to vary according to its designated position in the stack, thus increasing overall production costs for the integrated circuit.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
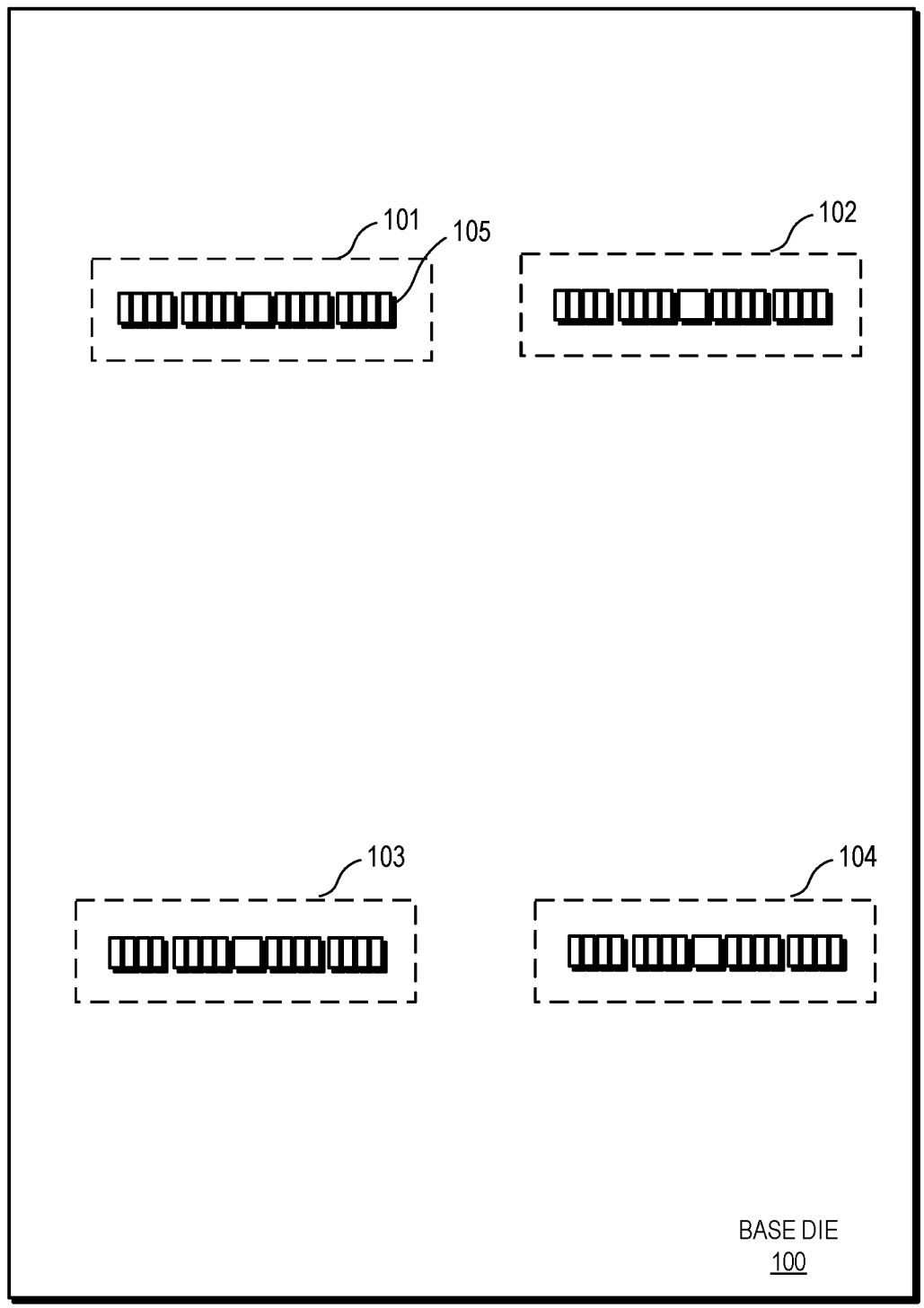
FIG. 1 is a block diagram of base die having through-silicon vias (TSVs) laid out in a symmetrical arrangement to facilitate flexible placement of additional dies on top of the base die in accordance with some embodiments.

FIGS. 1-7 illustrate integrated circuits and integrated circuit dies having TSVs laid out in symmetrical patterns. Because of the symmetrical arrangement of the TSVs and associated routing patterns, an integrated circuit is able to support operation of multiple similar dies that are placed in different positions in the integrated circuit. This in turn simplifies the design and production of the multiple similar dies, thus reducing development and manufacturing costs for the corresponding integrated circuits.

To illustrate, some integrated circuits are arranged in a 3-dimensional (3D) stack, wherein multiple dies are placed on top of a base die, with the base die including TSVs to provide connectivity, such as connectivity between circuits of the multiple dies and the base dies, to a power rail of a substrate, and the like. In some cases, the multiple dies have similar circuits and functionality, but are to be positioned differently on the base die in order to allow each of the multiple dies to, for example, connect to a chip interconnect. Thus, for example, in some configurations one die is flipped, mirrored, or rotated relative to another, similar die. In a conventional integrated circuit, the TSVs of the base die are not arranged to accommodate these different die positions, requiring each of the multiple dies to have at least somewhat different designs, layouts, and the like. These different designs and layouts must be designed and manufactured individually, increasing production and manufacturing costs for the integrated circuit.

In contrast to this conventional approach, using the techniques described herein the TSVs of the base die, and the corresponding routing patterns of the multiple dies, are arranged symmetrically. This in turn allows the same die, or substantially similar dies, to be placed in any of a number of different positions on top of the base die, while properly connecting to the TSVs. This also allows one or more base dies to be placed in different arrangements (e.g., in a mirrored arrangement) while properly connecting to the dies placed on top of the one or more based dies. Accordingly, only one die design and layout are needed for the multiple dies placed on top of the base die, reducing the cost and complexity of designing, producing, and manufacturing the integrated circuit.

FIGS. 1-7 are described with respect to an example integrated circuit including multiple dies that form a processor, in accordance with some embodiments. However, it will be appreciated that in other embodiments the techniques and configurations described herein are implemented in other types of integrated circuits. For example, in some embodiments, the techniques described herein are implemented in an integrated circuit that includes memory, such as a memory module having multiple integrated circuit dies. Furthermore, as used in this disclosure, the terms "die", and "chip" are interchangeably used. Similarly, the terms "integrated circuit die" and "semiconductor die" are interchangeably used.

FIG. 1 illustrates a base die 100 including a plurality of symmetrical TSV sets in accordance with some embodiments. The base die 100 is generally configured to form a base for a stacked die arrangement as described further herein. In particular, the base die 100 is configured to provide electrical connections (e.g., interconnects) between a plurality of dies stacked on top of the base die 100. For example, in some embodiments the base die 100 is the base die of a graphics processing unit (GPU), with a set of GPU chiplets stacked on top of the base die 100, and the base die 100 is configured to provide electrical connections between circuits of the GPU chiplets such as electrical connections between physical (PHY) layer components of the GPU chiplets. Accordingly, in different embodiments the base die 100 is a portion of an integrated circuit included in any of a variety of electronic devices, such as a desktop computer, laptop computer, server, smartphone, tablet, game console, and the like. Further, in different embodiments the base die 100 is a portion of any of a variety of types of processing units, such as a central processing unit (CPU), digital signal processor, vector processor, machine learning processor, parallel processor, artificial intelligence processor, and the like, or any combination thereof.

To support electrical connectivity for the stacked dies, the base die 100 includes sets of TSVs, including sets 101, 102, 103, and 104. Each of the sets 101-104 includes a plurality of TSVs (e.g., TSV 105 of set 101), and each TSV provides connectivity to a designated layer of the base die 100. For example, in some embodiments the base die 100 includes a plurality of semiconductor layers, and in particular includes a plurality of electrical connections. Each of the TSVs in a set provides a connection to one of the electrical connections, and each electrical connection thereby provides electrical connectivity between TSVs connected to the electrical connection.

Each of the sets 101-104 of TSVs is positioned to allow placement of a corresponding die above the TSVs, so that the set of TSVs connects to corresponding routing patterns of the die, and thus provides electrical connectivity to the circuits connected to the corresponding routing patterns. Further, each of the sets 101-104 is arranged in a symmetrical pattern about an axis, thereby allowing the dies placed over the set to be placed in any of a number of positions and orientations. That is, the symmetrical pattern of each of the sets 101-104 of TSVs is such that each set provides the proper connection to the corresponding base die layers, regardless of the position or orientation of the die positioned over the set of TSVs.

Figure 2:
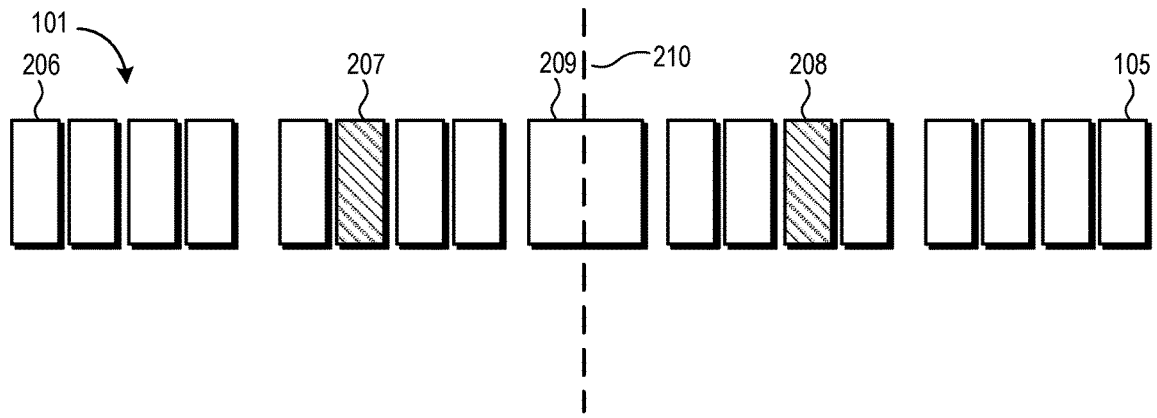
FIG. 2 is a block diagram illustrating an example of a symmetrical arrangement of TSVs in accordance with some embodiments.

FIG. 2 shows a closer view of the set 101 of TSVs in accordance with some embodiments. In the illustrated example, the set 101 includes a plurality of TSVs that are symmetrical about an axis 210. In particular, the set 101 includes eight TSVs arranged laterally on either side of a central TSV 209, with the axis 210 bisecting the central TSV 209. Further, the set 101 of TSVs is arranged in a repeating pattern, so that a TSV on one side of the axis 210 connects to the same electrical connection (e.g., the same signal or power connection) of the base die 100 as the corresponding TSV on the opposite side of the axis 210. For example, the furthest TSV along one side of the axis 210, designated TSV 206, connects to the same electrical connection as the TSV furthest from the axis 210 along the opposite side, designated TSV 105. Similarly, the TSV 207 connects to the same electrical connection as the corresponding TSV, designated TSV 208 on the opposite side of the axis 210. Further, the TSVs 207 and 208 connect to a different interconnect than the TSVs 206 and 105, as denoted by the different fill patterns shown in FIG. 2. Because of the symmetrical pattern of the TSVs of the set 101, the die placed over the set 101 is able to connect to the proper electrical connection, and therefore to the correct circuits, in different orientations and positions. This in turn simplifies the design and production of integrated circuits including the base die 100.

Figure 3:
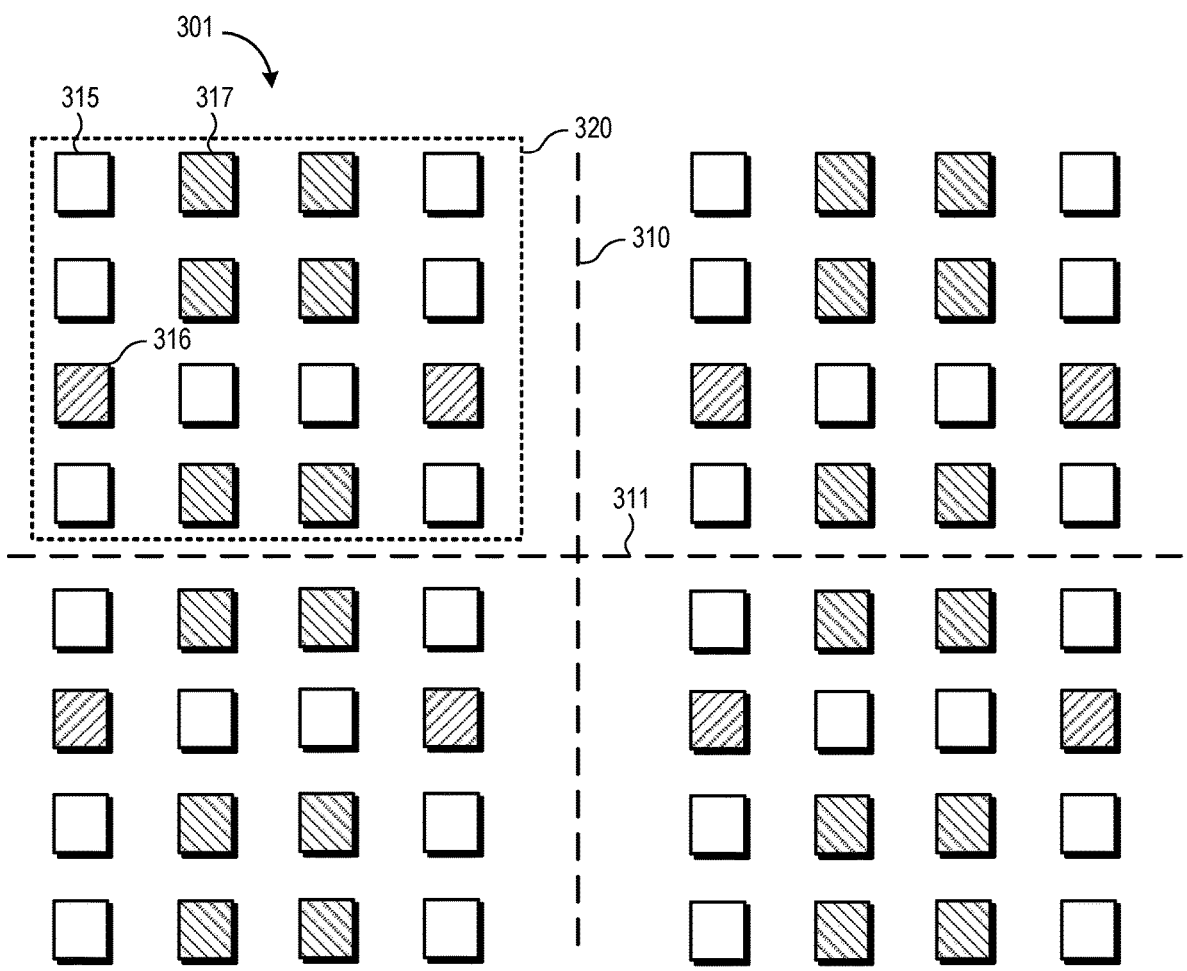
FIG. 3 is a block diagram illustrating an example of a symmetrical repeating pattern of TSVs in accordance with some embodiments.

In some embodiments, one or more of the sets 101-104 of TSVs include repeating patterns of TSVs that are symmetrical about a plurality of axes (e.g., two axes). An example is illustrated at FIG. 3 in accordance with some embodiments. In particular, FIG. 3 illustrates a set 301 of TSVs that is symmetrical about two axes: an axis 310, illustrated as a vertical axis at FIG. 3, and an axis 311, illustrated as a horizontal axis at FIG. 3. The axes 310 and 311 are perpendicular to each other, and therefore form four quadrants, with each quadrant including a subset of TSVs, such as subset 320 illustrated at FIG. 3 in the upper left quadrant.

Further, in FIG. 3, each TSV includes a fill pattern, designating the electrical connection of the base die 100 to which the TSV is connected, and with each fill pattern indicative of a different electrical connection. Thus, TSV 315 has a blank fill pattern, and is connected to a first electrical connection, TSV 316 has a diagonal fill pattern with a first orientation and is connected to a second electrical connection different from the first electrical connection, and TSV 317 has a diagonal fill pattern with a second orientation, and is connected to a third electrical connection different from the first electrical connection and the second electrical connection.

As illustrated, the subsets of TSVs are arranged so that the pattern of TSVs are symmetrical about at least one of the axes 310 and 311. Thus, for example, the pattern of TSVs in the upper left quadrant is symmetrical about the axis 311 with the pattern of TSVs in the lower left quadrant, is symmetrical about the axis 310 with the pattern of TSVs in the upper right quadrant and is symmetrical about both the axis 310 and the axis 311 with the pattern of TSVs in the lower right quadrant. The symmetrical arrangement of the TSVs ensures that a die placed over the set 301 of TSVs connects to the appropriate electrical connections when the die is in any one of a number of orientations or positions.

Figure 4:
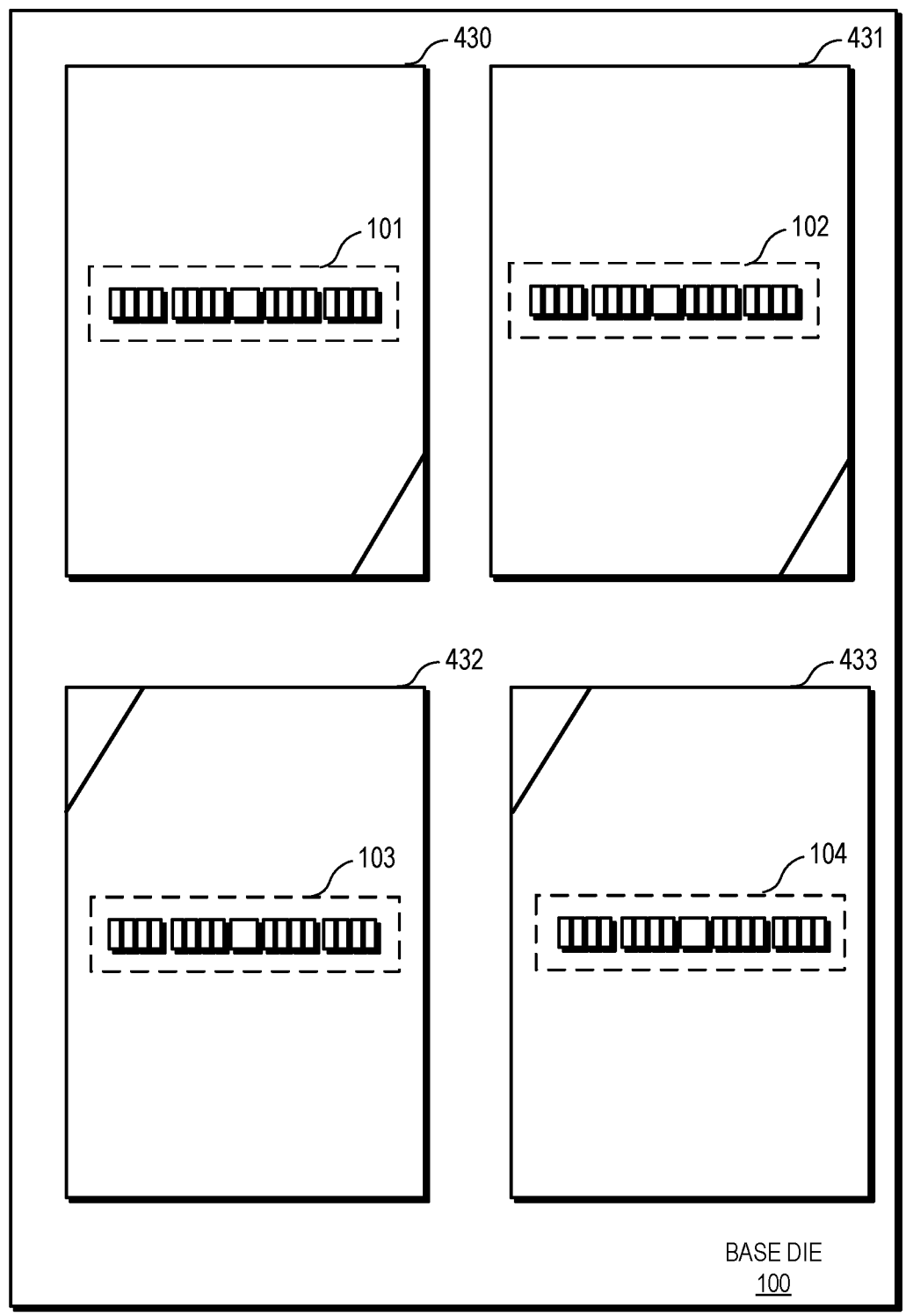
FIG. 4 is a diagram illustrating a plurality of dies placed over the TSVs of FIG. 1 in different positions in accordance with some embodiments.

FIG. 4 illustrates placement of a set of dies on top of the base die 100 in accordance with some embodiments. In the illustrated example, dies 430, 431, 432, and 433 have been placed on the base die 100, over respective ones of the sets 101-104 of TSVs. In particular, die 430 is placed on top of the set 101, die 431 is placed on top of the set 102, die 432 is placed on top of set 103, and die 433 is placed on top of set 104. The dies 430-433 are placed on top of the respective sets 101-104 of TSVs so that each set of TSVs provides electrical connections to one or more circuits incorporated into each die.

For example, in some embodiments, each of the dies 430-433 is a semiconductor die incorporating a plurality of circuits to collectively form a processing unit chiplet, such as a GPU chiplet. Each of the dies 430-433 includes similar circuitry such that, in some embodiments, the dies 430-433 are formed using the same semiconductor design and process, and in some cases are cut from the same or similar semiconductor wafers. Each of the dies 430-433 further includes a layer, referred to as the redistribution layer (RDL) that includes a set of metal connections. These metal connections are routed so that, when one of the dies is placed over a set of TSVs, the metal connections provide an electrical connection between circuits of the die and the TSVs. As noted above, the TSVs themselves provide connections to electrical connections of the base die 100. Accordingly, the RDL layers, the sets of TSVs 101-104, and the electrical connections of the base die 100, are designed and formed to provide electrical connections between circuits of the dies 430-433, between those circuits and pins or other terminals of an integrated circuit, between those circuits and circuits of other dies (not shown), and the like, or any combination thereof.

As noted above, in at least some embodiments the dies 430-433 have the same design, and thus are formed to include the same configuration of circuitry. However, in at least some cases it is useful to orient the dies 430-433 differently with respect to the base die 100. For example, in some embodiments the dies 430-433 are to be connected via an interconnect (not shown) that runs horizontally through or above the center of the base die 100, and the dies 430-433 are oriented differently to provide for easy connection to the interconnect. In the example of FIG. 4, each of the dies 430-433 is depicted with a triangle shape that indicates the orientation of the corresponding die. Thus, in the depicted example, the dies 430 and 431 are in a first orientation, as shown by the triangles of each die in the lower right-hand corner. The dies 432 and 433 are in a second orientation that is rotated 180 degrees with respect to the first orientation, as shown by the triangles of each die in the upper left-hand corner. Because the sets 101-104 of TSVs are arranged symmetrically, the dies 430-433 are able to be placed in these different configurations and still properly connect the respective circuitry to the correct electrical connections of the base die 100. That is, the sets 101-104 of TSVs provide the correct connections for the circuitry of the dies 430-433 in both the first orientation, and the second orientation that is rotated with respect to the first orientation.

Figure 5:
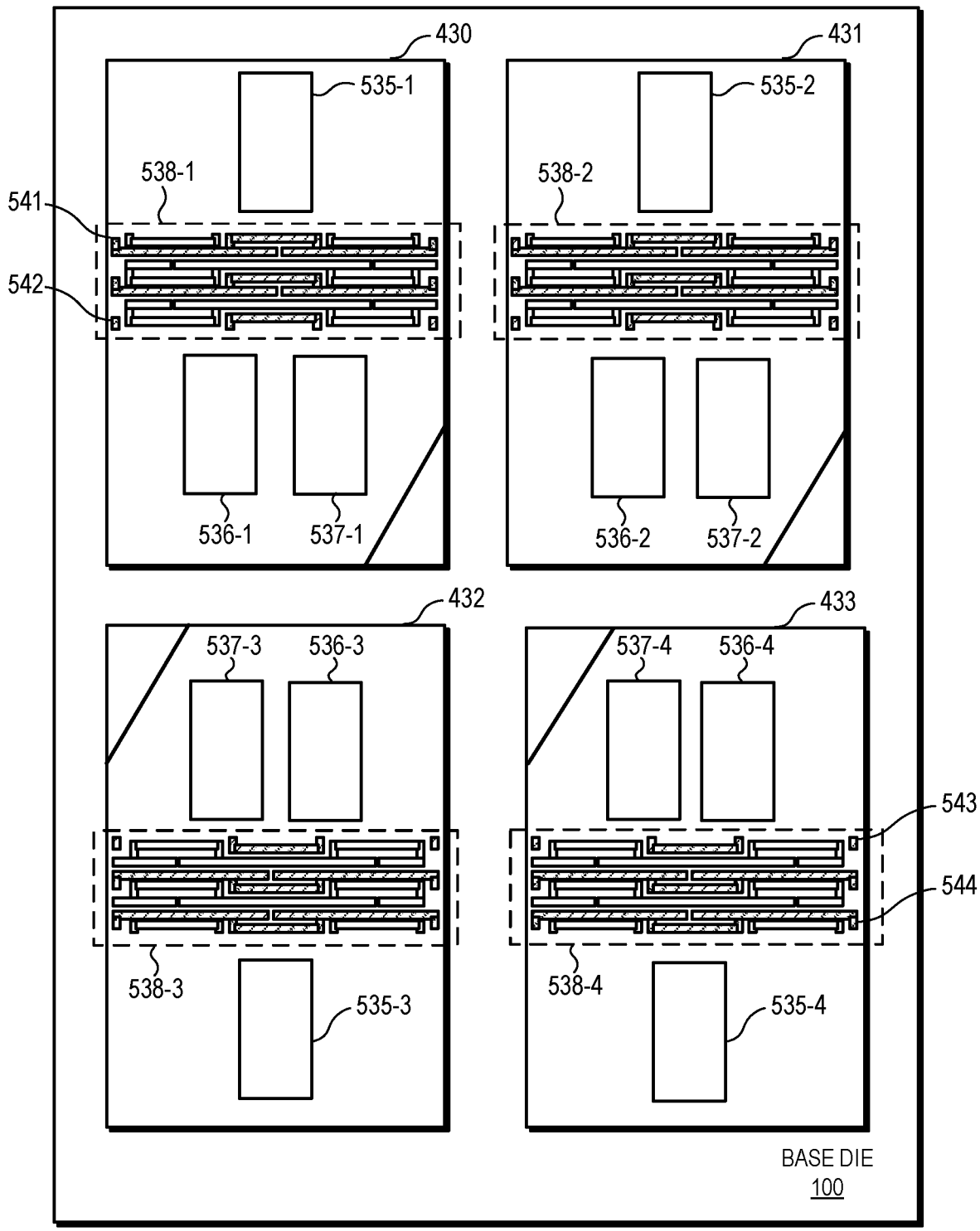
FIG. 5 is a diagram illustrating routing patterns for the plurality of dies of FIG. 4 in accordance with some embodiments.

In at least some embodiments, the dies 430-433 further support die placement in different orientations by including symmetrical RDL routing patterns. An example is illustrated at FIG. 5 in accordance with some embodiments. In particular FIG. 5 illustrates each of the dies 430-433 including 3 similar modules, designated modules 535, 536, and 537. Thus, die 430 includes modules 535-1, 536-1, and 537-1, die 431 includes modules 535-2, 536-2, and 537-2, die 432 includes modules 535-3, 536-3, and 537-3, and die 433 includes modules 535-4, 536-4, and 537-4. Each of the modules 535-537 is formed at the corresponding die to include the same circuitry. Thus, module 535-1 has the same circuitry as module 535-2, 535-3, and 535-4. In some embodiments, each of the dies 430-431 is a GPU chiplet, and each of the modules 535-537 is an independent set of processing elements, such as a workgroup processor (WGP), shader engine, and the like.

Each of the dies 430-431 includes an RDL layer that is formed to include metal connections configured in a specified pattern. These patterns are referred to herein as the RDL routing patterns and are illustrated at FIG. 5 as the RDL routing patterns 538. In particular, die 430 includes RDL routing pattern 538-1, die 431 includes RDL routing pattern 538-2, die 432 includes RDL routing pattern 538-3, and die 433 includes RDL routing pattern 538-4. The RDL routing patterns 538 are designed and formed to be symmetrical about at least one axis. This ensures that the RDL electrical connections connect to the proper TSVs in the sets 101-104 of TSVs, when the dies 430-433 are placed on the base die 100 in different orientations.

For example, in some embodiments the base die 100 includes a TSV at location 541 that provides a connection to a first electrical connection, and a TSV at location 544 that also provides a connection to the first electrical connection. Similarly, the base die 100 includes a TSV at location 542 that provides a connection to a first electrical connection, and a TSV at location 543 that also provides a connection to the first electrical connection. This allows the dies 430 and 433 to be placed in the different illustrated orientations while still connecting to the intended electrical connections.

Figure 6:
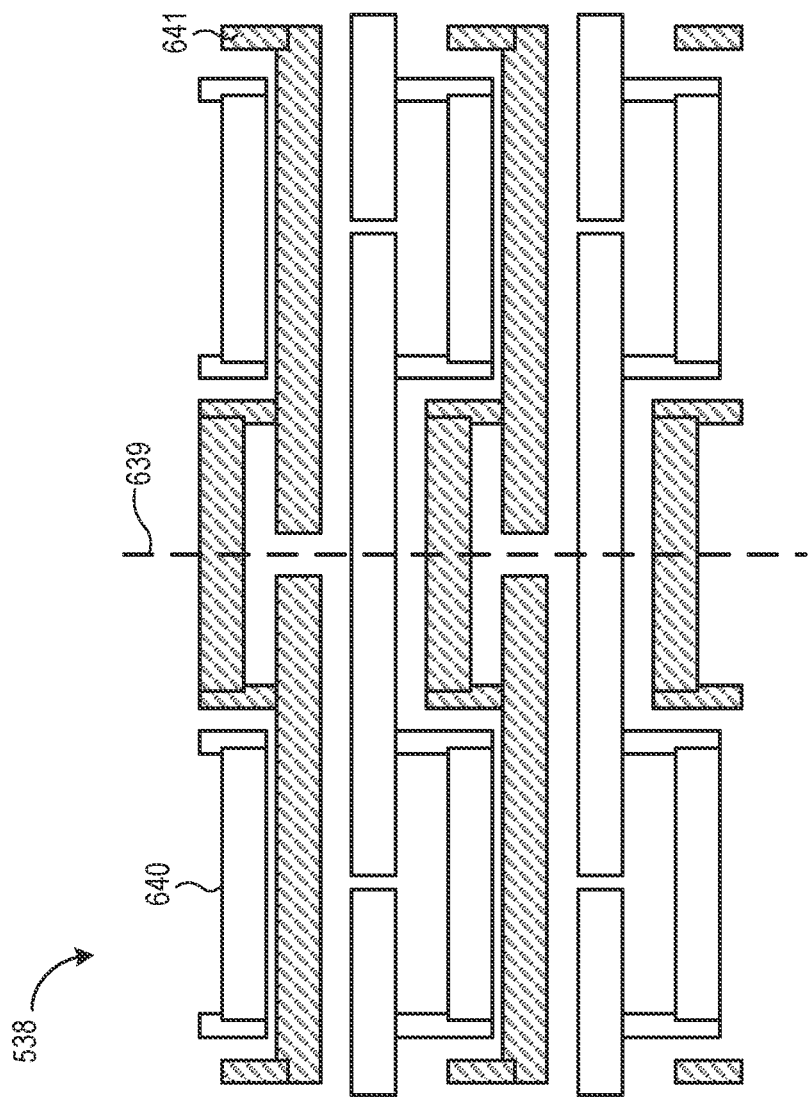
FIG. 6 is a diagram illustrating a routing pattern of FIG. 5 in accordance with some embodiments.

FIG. 6 illustrates a closer view of the RDL routing pattern 538 in accordance with some embodiments. The routing pattern 538 includes a set of metal pathways (e.g., pathways 640, 641) arranged in a specified pattern. The pattern is specified such that the pattern is symmetrical about an axis 639. This symmetry ensures that, in conjunction with the symmetrical pattern of the sets 101-104 of TSVs, the dies 430-433 are able to be places on top of the sets 101-104 of TSVs in different orientations, without requiring substantial redesign of the individual dies. This in turn simplifies design and production of the dies 430-433.

Figure 7:
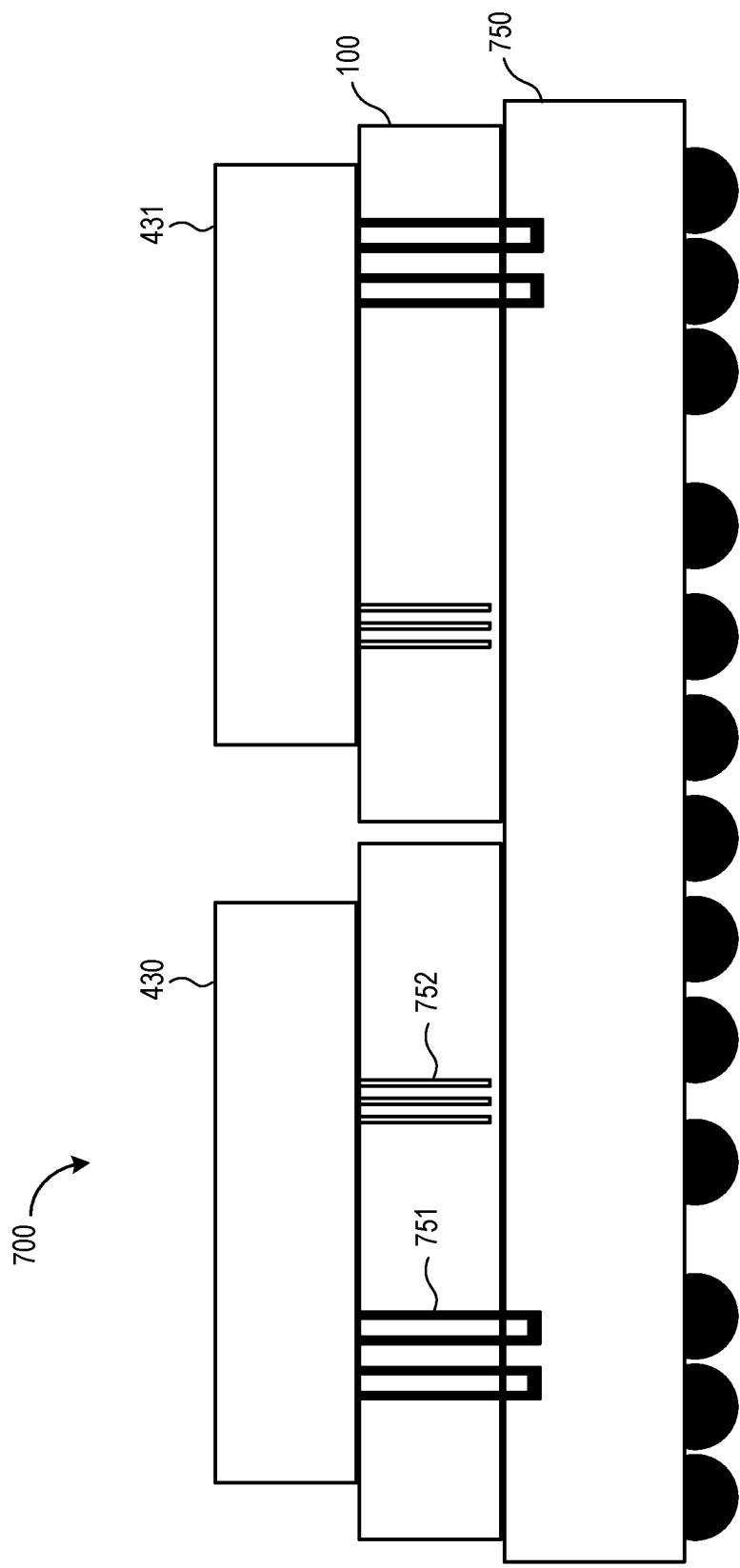
FIG. 7 is a cross-sectional view of an integrated circuit including the base die of FIG. 1 in a 3-dimensional stack in accordance with some embodiments.

FIG. 7 illustrates a cross-sectional view of a 3D stacked integrated circuit 700 in accordance with some embodiments. The integrated circuit 700 includes a substrate 750, a set of base dies 100, and dies 430 and 431 stacked on the base dies 100. The integrated circuit 700 also includes sets of TSVs of two different types: power TSVs (e.g., power TSV 751) and signal TSVs (e.g., signal TSV 752. The power TSVs are formed with both the base die 100 and the substrate 750, such that a power TSV passes entirely through the base die 100. This allows the power TSV to provide a connection to a power rail of the substrate 750 by a circuit of the stacked dies 430 and 431. In at least some embodiments, both the power TSVs and the signal TSVs are included each of the TSV sets 101-104.

In some embodiments, the apparatus and techniques described above are implemented in a system including one or more integrated circuit (IC) devices (also referred to as integrated circuit packages or microchips), such as the integrated circuit dies described above with reference to FIGS. 1-7. Electronic design automation (EDA) and computer aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory) or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A device, comprising:
    a first semiconductor die, including:
        a first subset of a plurality of subsets of through-silicon vias (TSVs), wherein each TSV of the first subset is configured to transmit a first signal, and wherein the TSVs of the first subset are symmetrically arranged into quadrants of the first semiconductor die such that each TSV of the first subset is mirrored by another TSV of the first subset in each quadrant; and
        a second subset of the plurality of subsets of TSVs, wherein each TSV of the second subset is configured to transmit a second signal, and wherein the TSVs of the second subset are symmetrically arranged into the quadrants such that each TSV of the second subset is mirrored by another TSV of the second subset in each quadrant.

2. The device of claim 1, wherein the quadrants of the first semiconductor die are defined by a first axis and a second axis, wherein the second axis is perpendicular to the first axis.

3. The device of claim 1, further comprising:
    a second semiconductor die placed over the first semiconductor die and having a set of TSVs corresponding to TSVs of a first quadrant of the first semiconductor die.

4. The device of claim 3, further comprising:
    a third semiconductor die placed over the first semiconductor die and having a set of TSVs corresponding to TSVs of a second quadrant of the first semiconductor die.

5. The device of claim 4, wherein:
    the second semiconductor die and the third semiconductor die include substantially similar circuits.

6. The device of claim 4, wherein:
    the second semiconductor die is placed in a first orientation over the first quadrant and the third semiconductor die is placed in a second orientation over the second quadrant, the second orientation different from the first orientation.

7. The device of claim 3, wherein the second semiconductor die comprises: a set of electrical connection routing patterns arranged symmetrically around a third axis.

8. The device of claim 1, wherein:
    each TSV of the first subset is configured to be connected to a first electrical connection in a base die.

9. The device of claim 8, wherein:
    each TSV of the second subset is configured to be connected to a second electrical connection in the base die, wherein the second electrical connection is different from the first electrical connection.

10. The device of claim 9, wherein:
    the first electrical connection is a power connection and the second electrical connection is a signal connection.

11. The device of claim 6, wherein:
    the second semiconductor die is not placed over the second quadrant and the third semiconductor die is not placed over the first quadrant.

12. A semiconductor, comprising:
    a base die comprising a plurality of sets of through-silicon vias (TSVs), each set of the plurality of sets of TSVs comprising TSVs arranged symmetrically around quadrants defined by a first axis and a second axis, wherein each set of TSVs is configured to be connected to a respective electrical connection; and
    a plurality of dies stacked on the base die, each of the plurality of dies stacked over at least one of the quadrants.

13. The semiconductor of claim 12, wherein:
    each of the plurality of dies comprises a set of electrical connection routing patterns connecting to at least one respective TSV from each of the plurality of sets of TSVs.

14. The semiconductor of claim 12, wherein:
    a first die of the plurality of dies is stacked in a first orientation, and a second die of the plurality of dies is stacked in a second orientation different from the first orientation.

15. The semiconductor of claim 14, wherein:
    the second orientation is rotated 180 degrees with respect to the first orientation.

16. The semiconductor of claim 12, wherein:
    each of the plurality of dies is a chiplet of a plurality of chiplets.

17. The semiconductor of claim 12, wherein:
    a set of the plurality of sets comprises eight TSVs, wherein the TSVs are arranged in pairs in each quadrant.

18. A system, comprising:
    a semiconductor die, comprising:
        a first subset of a plurality of subsets of through-silicon vias (TSVs), wherein each TSV of the first subset is configured to be connected to a first electrical connection, and wherein the TSVs of the first subset are symmetrically arranged about a first axis and a second axis, wherein the second axis is nonparallel to the first axis; and a second subset of the plurality of subsets of TSVs, wherein each TSV of the second subset is configured to be connected to a second electrical connection, and wherein the TSVs of the second subset are symmetrically arranged about the first axis and the second axis.

19. The system of claim 18, wherein:
the TSVs of the first subset are power TSVs and the TSVs of the second subset are signal TSVs.

20. The system of claim 18, wherein:
the second axis is perpendicular to the first axis.

* * * * *